(12) United States Patent
Yabuta et al.

(10) Patent No.: US 8,044,402 B2
(45) Date of Patent: Oct. 25, 2011

(54) AMORPHOUS INSULATOR FILM AND THIN-FILM TRANSISTOR

(75) Inventors: Hisato Yabuta, Machida (JP); Nobuyuki Kaji, Kawasaki (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 149 days.

(21) Appl. No.: 12/522,371

(22) PCT Filed: Feb. 2, 2008

(86) PCT No.: PCT/JP2008/052091
§ 371 (c)(1),
(2), (4) Date: Jul. 7, 2009

(87) PCT Pub. No.: WO2008/102651
PCT Pub. Date: Aug. 28, 2008

(65) Prior Publication Data
US 2010/0051947 A1    Mar. 4, 2010

(30) Foreign Application Priority Data

Feb. 19, 2007 (JP) ................. 2007-037994

(51) Int. Cl.
*H01L 29/49* (2006.01)
(52) U.S. Cl. ................. 257/66; 257/E29.151; 174/137 B
(58) Field of Classification Search .............. 174/137 B; 257/57, 66, E29.151, E29.273; 249/43, 122, 249/138
See application file for complete search history.

(56) References Cited

U.S. PATENT DOCUMENTS

| | | | |
|---|---|---|---|
| 5,840,600 A * | 11/1998 | Yamazaki et al. | 438/151 |
| 6,331,474 B1 | 12/2001 | Hayashi et al. | |
| 6,794,275 B2 | 9/2004 | Kondo et al. | |
| 6,855,621 B2 | 2/2005 | Kondo et al. | |
| 6,858,308 B2 | 2/2005 | Kondo et al. | |
| 7,282,132 B2 | 10/2007 | Iwata et al. | |
| 2005/0199959 A1* | 9/2005 | Chiang et al. | 257/368 |
| 2006/0011995 A1 | 1/2006 | Yamazaki et al. | |
| 2007/0090365 A1 | 4/2007 | Hayashi et al. | |
| 2009/0272970 A1 | 11/2009 | Aiba et al. | |

FOREIGN PATENT DOCUMENTS

| | | |
|---|---|---|
| JP | 2-90568 A | 3/1990 |
| JP | 2-258614 A | 10/1990 |

OTHER PUBLICATIONS

PCT International Search Report and Written Opinion of the International Searching Authority, mailed May 16, 2008, in PCT/JP2008/052091.

(Continued)

*Primary Examiner* — Thomas L Dickey
(74) *Attorney, Agent, or Firm* — Fitzpatrick, Cella, Harper & Scinto

(57) ABSTRACT

An amorphous insulator film is provided which is composed of silicon (Si) oxide, in which the amorphous insulator film includes Ar and an amount of Ar included therein is equal to or larger than 3 at. % in terms of atomic ratio with respect to Si.

8 Claims, 3 Drawing Sheets

OTHER PUBLICATIONS

Jelenkovic, et al., "Charge relaxation in nitrided and non-nitrided sputtered oxide", Journal of Non-Crystalline Solids, vol. 254, 1999, pp. 99-105.

Serikawa, et al., "High-Quality Polycrystalline Si TFTs Fabricated on Stainless-Steel Foils by Using Sputtered Si Films", IEEE Transactions on Electron Devices, vol. 49, No. 5, May 2002, pp. 820-825.

Yabuta, et al., "High-mobility thin film transistor with amorphous InGaZnO4 channel fabricated by room temperature rf-magnetron sputtering", Applied Physics Letters, vol. 89, 2006, pp. 112123-1-112123-3.

Leplan, et al., "Residual stresses in evaporated silicon dioxide thin films: Correlation with deposition parameters and aging behavior", Journal of Applied Physics, vol. 78, No. 2, Jul. 15, 1995, pp. 962-968.

U.S. Appl. No. 12/374,665, International Filing Date Jul. 26, 2007, Itagaki, et al.

U.S. Appl. No. 12/515,268, International Filing Date Nov. 20, 2007, Hayashi, et al.

U.S. Appl. No. 12/515,267, International Filing Date Nov. 29, 2007, Omura, et al.

U.S. Appl. No. 12/534,436, filed Aug. 3, 2009, Hayashi, et al.

* cited by examiner

AMORPHOUS INSULATOR FILM AND THIN-FILM TRANSISTOR

TECHNICAL FIELD

The present invention relates to an amorphous insulator film and a thin-film transistor using the same.

BACKGROUND ART

In recent years, liquid crystal displays, plasma displays, and organic EL displays have been actively developed regardless of sizes thereof. An attempt has been made to use an amorphous silicon thin film, a low-temperature poly-silicon thin film, or an oxide semiconductor thin film for a thin-film transistor (TFT) serving as a pixel driving device for the displays. In particular, a TFT using an amorphous oxide semiconductor film for a channel can be applied to a flexible display using a plastic substrate formed at room temperature. Therefore, active research and development have been made as disclosed in Applied Physics Letters, Volume 89, 112123-1, pp. 1 to 3.

In the TFT disclosed in Applied Physics Letters, Volume 89, 112123-1, pp. 1 to 3, an amorphous InGaZnO$_4$ thin film is used which is deposited as an amorphous oxide semiconductor channel layer by a sputtering method. A Y$_2$O$_3$ film is used which is deposited as a gate-insulator film by a sputtering method. The Y$_2$O$_3$ film serving as the gate-insulator film is more expensive than a silicon oxide (SiO$_2$) film normally used as the gate-insulator film of the TFT. Therefore, the conversion of the Y$_2$O$_3$ film to a silicon-containing amorphous insulator film such as a SiO$_2$ film has been expected.

The silicon-containing amorphous insulator film (hereinafter, referred to also as insulating film) such as the SiO$_2$ film is normally produced by a chemical vapor deposition method (CVD method) in many cases. In order to obtain an insulator film having excellent insulation performance by the CVD method, a deposition temperature equal to or higher than 300° C. is normally necessary, so it is difficult to form the insulator film on a plastic substrate.

As described above, the amorphous oxide semiconductor film used for the TFT can be formed by a sputtering method at a deposition temperature equal to or lower than 300° C. Therefore, it is desirable that the insulator film can be formed by a sputtering method as in the case where the amorphous oxide semiconductor film is formed. This is because a substrate having a low heat resistance, such as the plastic substrate, can be employed.

However, the conventional silicon-containing amorphous insulator film deposited by a sputtering method is inferior in insulation characteristic to the conventional silicon-containing amorphous insulator film deposited by a CVD method. Therefore, the silicon-containing amorphous insulator film deposited by the sputtering method has not been put to practical use up to now. Thus, for example, when devices are formed on the plastic substrate, it is necessary to form the insulator film at a temperature lower than the deposition temperature using the CVD method. As described in Japanese Patent Application Laid-Open No. H02-90568, it is desired to improve the performance of the insulator film formed by the sputtering method.

In Japanese Patent Application Laid-Open No. H02-258614, an SiO$_2$ film containing 5 atomic % or less of Ar is disclosed as a magnetic gap material of a magnetic head. However, no applications of the SiO$_2$ film to the gate-insulator film of the TFT are disclosed.

DISCLOSURE OF THE INVENTION

An object of the present invention is to provide an amorphous insulator film which is made of Si oxide and has an excellent characteristic, and a thin-film transistor using the amorphous insulator film.

In order to solve the above-mentioned conventional problem, the inventors of the present invention have extensively studied an amorphous insulator film which is formed by a sputtering method and made of silicon oxide. As a result, findings about a correlation between the Ar content of the insulator film and an insulation characteristic thereof have been obtained, and an amorphous insulator film which has an excellent insulation characteristic and is made of silicon oxide has been invented.

The present invention has been accomplished on the basis of the findings described above, and is directed to an amorphous insulator film which is used as a gate-insulator film of a thin-film transistor and which comprises silicon (Si) oxide, wherein the amorphous insulator film includes Ar and an amount of Ar included therein is equal to or larger than 3 atomic percent in terms of atomic ratio with respect to Si.

According to the present invention, the amorphous insulator film excellent in insulation characteristic can be obtained. Further, when the insulator film according to the present invention is used, a thin-film transistor whose performance is superior to, and whose cost is lower than, conventional thin film transistors can be obtained by a low-temperature manufacturing process.

Further features of the present invention will become apparent from the following description of exemplary embodiments with reference to the attached drawings.

BEST MODE FOR CARRYING OUT THE INVENTION

Figure 1:
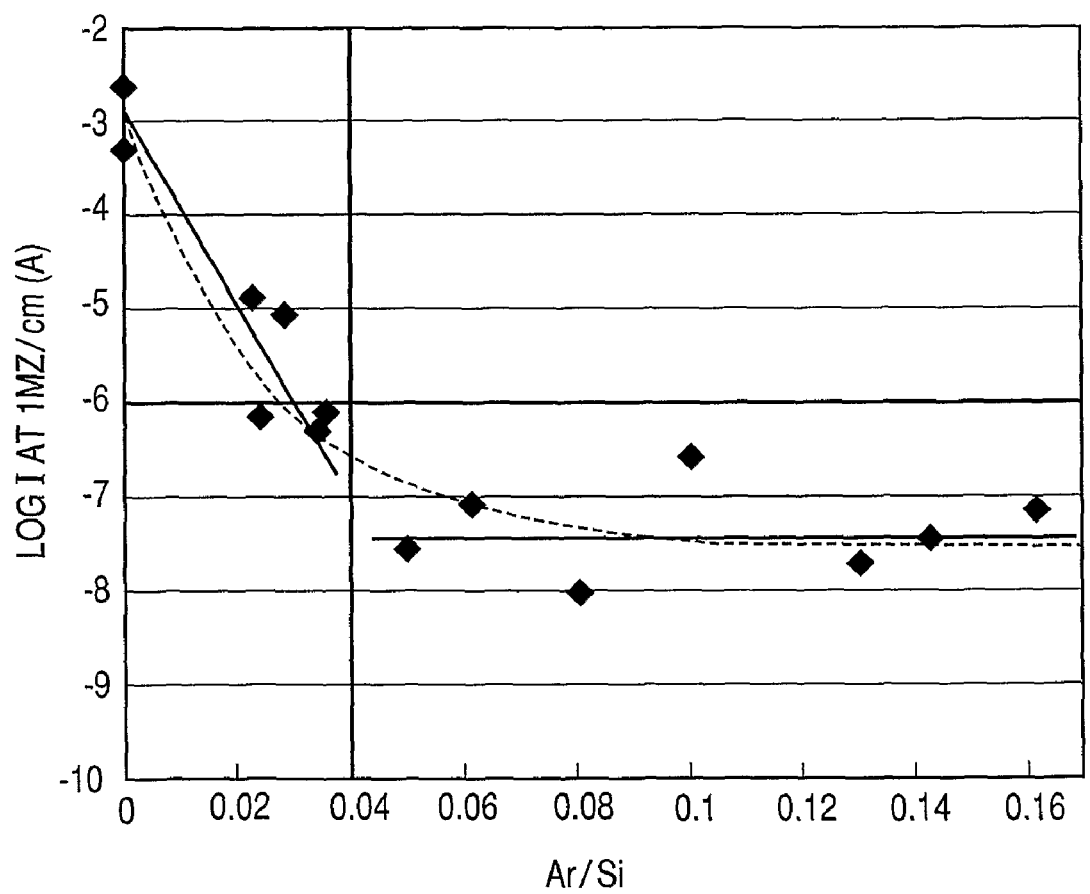
FIG. 1 is a graph illustrating a correlation between an Ar/Si ratio of an amorphous insulator film according to the present invention and a current density thereof at the time of application of 1 MV/cm.

The best mode presently contemplated by the present inventors for carrying out the present invention will be described. Up to now, as disclosed in Japanese Patent Application Laid-Open No. H02-90568, it has been considered to be a cause of deterioration in the insulation characteristic of the silicon oxide film produced by a sputtering method, that the silicon oxide film is damaged by Ar particles during sputtering. A method of forming the silicon oxide film in a condition in which the amount of Ar gas in sputtering gas is minimized and the amount of oxygen gas therein is maximized has been employed as a method of improving the insulation characteristic of the silicon oxide film. That is, it has been considered that the insulation characteristic is more excellent as the amount of Ar contained in the silicon oxide film becomes smaller.

However, with respect to a relationship between a ratio of Ar and oxygen in the sputtering gas and the insulation characteristic of the silicon oxide film, the film formation condition of the silicon oxide film is not necessarily sufficiently described in the above prior art documents and thus the details of the film formation condition are unclear. Also, a correlation between the amount of Ar contained in the formed silicon oxide film and the insulation characteristic of the silicon oxide film is not disclosed.

The inventors of the present invention focused on and extensively studied a relationship between the amount of Ar contained in the silicon oxide film and the insulation characteristic of the silicon oxide film. Silicon oxide films were produced by a sputtering method in various conditions, and accordingly, it was found that there is a correlation between the amount of Ar contained in the silicon oxide film and the insulation characteristic thereof. In addition, it was found that even when the amount of Ar in the sputtering gas is 100% (other gases such as oxygen gas are not present), a silicon oxide film which is produced in an adjusted film formation condition and contains Ar gas in a specific range exhibits an excellent insulation characteristic.

As a result, unlike the conventional method of forming the silicon oxide film, in which attention is focused on reduction in the amount of Ar during sputtering, the silicon oxide film excellent in insulation characteristic can be obtained by setting the amount of Ar contained in the silicon oxide film to a suitable range, thus the present invention has been completed.

That is, in the present invention, a silicon oxide amorphous insulator film is employed which is made of silicon oxide and contains Ar where the amount of Ar contained in the amorphous insulator film is within a specific range in atomic ratio with respect to Si. Therefore, an insulating film having excellent characteristics can be obtained. When the insulating film is used, a device having an excellent characteristic, such as a thin-film transistor, can be obtained.

The amorphous insulator film according to the present invention is the Si oxide amorphous insulator film. The amorphous insulator film contains Ar, and the amount of Ar contained in the amorphous insulator film is equal to or larger than 3 atomic percent in terms of atomic ratio with respect to Si (Ar/Si≧3 at. %) (hereinafter, atomic percent is referred to as "at. %").

The atomic ratio is desirably equal to or larger than 4 atomic % (Ar/Si≧4 at. %) and more desirably equal to or larger than 5 atomic % (Ar/Si≧5 at. %).

The upper limit of the amount of Ar contained in the amorphous insulator film is desirably equal to or smaller than 17 atomic % (Ar/Si≦17 at. %) and more desirably equal to or smaller than 16 atomic % (Ar/Si≦16 at. %).

When film formation parameters such as a potential of a substrate and a potential of a substrate holder at the time of film formation are adjusted, the amorphous insulator film made of silicon oxide contains the above-mentioned amount of Ar and has an excellent insulation characteristic. Therefore, an amorphous insulator film made of silicon oxide can be obtained in which a current density when an electric field of 1 MV/cm is applied to the amorphous insulator film is equal to or smaller than $1 \times 10^{-6}$ A/cm². In addition, an amorphous insulator film made of silicon oxide can be obtained in which a current density when an electric field of 1 MV/cm is applied to the amorphous insulator film is equal to or smaller than $3 \times 10^{-7}$ A/cm².

A sputtering method is desirably used as the method of forming the amorphous insulator film according to the present invention. An rf magnetron sputtering method is more desirably used as the sputtering method. The amorphous insulator film according to the present invention is desirably formed at a temperature equal to or lower than 300° C. and more desirably formed at room temperature. The amorphous insulator film is desirably formed in a state in which at least one of the potential of the substrate and the potential of the substrate holder at the time of film formation is positive relative to the ground potential or in an open state in which at least one of the substrate and the substrate holder is spaced from the ground.

An example of a device using the amorphous insulator film according to the present invention includes a TFT. In the TFT using the amorphous insulator film, the amorphous insulator film is used as a gate-insulator film thereof.

It is desirable to use an oxide semiconductor film as a channel layer of the TFT. It is more desirable to use an amorphous oxide semiconductor film. The channel layer is desirably formed by a sputtering method. In addition, the channel layer is desirably formed by a vacuum deposition method including a pulsed laser deposition (PLD) method.

Therefore, according to the present invention, the amorphous insulator film whose insulation characteristic is excellent is obtained. When the amorphous insulator film is used, a TFT which is higher in performance and lower in cost as compared with a conventional TFT can be manufactured at temperature lower than conventional manufacturing process temperature.

For example, in the TFT using the oxide semiconductor thin film as the channel layer, a device which has high performance, stability and reliability can be provided at low cost. Even in a situation where temperature cannot be raised during a manufacturing process, such as a case where the above devise is formed on a plastic substrate, the device can be formed at low temperature.

EXPERIMENTAL EXAMPLE

Next, the present invention will be described in more detail with reference to Experimental Example. In order to solve the conventional problem, the inventors of the present invention have studied the amorphous insulator film made of silicon oxide which is formed by a sputtering method, and particularly, examined a correlation between the amount of Ar contained in the amorphous insulator film and the insulation characteristic thereof. A parallel-plate rf magnetron sputtering apparatus was used as a sputtering apparatus. An $SiO_2$ plate with a diameter of 75 mm was used as a target. The substrate temperature at the time of film formation was set at room temperature.

A glass substrate on which a Ti/Au/Ti multilayer was formed as an electrode was used as a substrate. The amorphous insulator film made of silicon oxide was produced in an open state (also referred to as "floating state") in which the substrate and a substrate holder are spaced from the ground. Film formation parameters which were varied were a substrate position (substrate was provided in the direction vertical to the target or in the obliquely upper direction to the target), a deposition pressure (0.06 Pa to 2 Pa), a film formation gas composition ($0 \leq O_2/(Ar+O_2) \leq 0.50$), and target power (10 W to 400 W).

The amount of Ar contained in the produced amorphous insulator film made of silicon oxide was measured by fluorescent X-ray analysis. The Ar/Si ratio in the amorphous insulator film was controlled by reducing the film formation gas composition (Ar/O$_2$ ratio) as the film formation parameter. For example, a ratio of O$_2$ in the film formation gas was increased to increase the Ar/Si ratio. Even in a film formation condition in which O$_2$ is not introduced and thus only Ar is used, when the target power is reduced, the Ar/Si ratio can be significantly increased.

Figure 2:
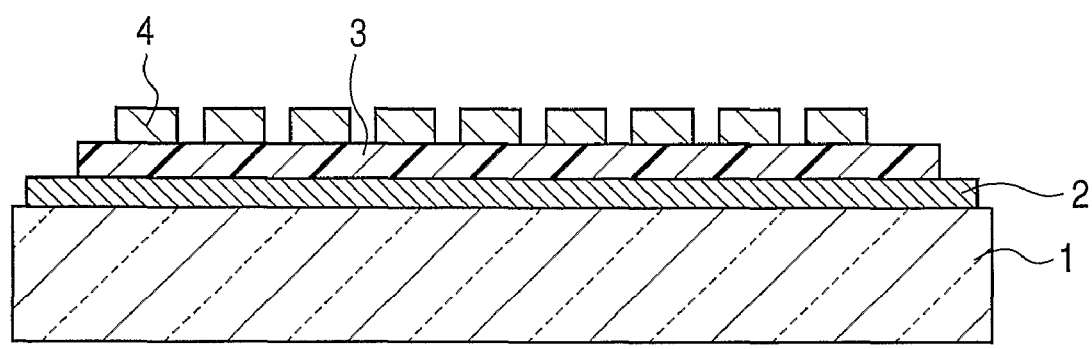
FIG. 2 is a schematic view illustrating a structure of a parallel-plate capacitor device for I-V characteristic evaluation which is used in Experimental Example and Example 1 according to the present invention.

Au(40 nm)/Ti(5 nm) multilayer electrodes each having a diameter of 0.3 mm were formed on the produced amorphous insulator film to produce parallel-plate capacitor devices as illustrated in FIG. 2 and then current-voltage characteristics of the amorphous insulator film were measured. FIG. 1 illustrates the dependence of a current density on the Ar/Si ratio at the time of application of 1 MV/cm, which was obtained from the result of the measured current-voltage characteristics of the amorphous insulator film.

As can be seen from FIG. 1, a leak current characteristic in which the current density at the time of application of 1 MV/cm was equal to or smaller than $1 \times 10^{-6}$ A/cm$^2$ was obtained in a region of Ar/Si$\geqq$3 at. %. The amorphous insulator film having such a leak current characteristic was applied to a gate-insulator film of a TFT having a structure illustrated in FIG. 3. As a result, except for a defective device caused by an error during a manufacturing process and a device using a low-resistance channel semiconductor layer, an off-current value of a transfer characteristic of the TFT as illustrated in FIG. 4 was equal to or smaller than $10^{-12}$ A, thus the excellent TFT characteristic was exhibited.

Therefore, the region of Ar/Si$\geqq$3 at. % can be used as an index for the amorphous insulator film (made of Si oxide) exhibiting the excellent insulation characteristic. As is apparent from the graph of FIG. 1, in a region in which the Ar/Si ratio is small in relation to a point of Ar/Si=4 at. %, the leak current value is reduced with an increase in the amount of Ar. In a region of Ar/Si$\geqq$4 at. %, the leak current value is held to be substantially constant regardless of the amount of Ar increases.

As is apparent from the above, an effect of reduction in leak current along with an increase in the amount of Ar becomes maximum in the region in which the Ar/Si ratio is equal to or larger than 4 at. %. The point of Ar/Si=4 at. % corresponds to an intersection obtained by extrapolation of two lines shown in FIG. 1, which are drawn by interpolation of the plotted experimental data. When a region of the Ar/Si ratio is defined on the basis of plot points of the experimental data, it comes to be Ar/Si$\geqq$5 at. %. Therefore, the region of Ar/Si$\geqq$5 at. % can be defined as a region in which the effect of reduction in leak current along with the increase in the amount of Ar is obtained in a high probability.

In order to set an upper limit value of the Ar/Si ratio to obtain an amorphous insulator film having a maximum Ar/Si ratio, sputtering power was set to be 50 W, 20 W, and 10 W to produce amorphous insulator films made of Si oxide. The Ar/Si ratios of the obtained amorphous insulator films had the following relationship: Ar/Si (film produced at 50 W)>Ar/Si (film produced at 10 W)>Ar/Si (film produced at 20 W). When the sputtering power was equal to or larger than 20 W, the Ar/Si ratio increased along with reduction in sputtering power.

On the other hand, the Ar/Si ratio at the sputtering power of 10 W is smaller than the Ar/Si ratio at the sputtering power of 20 W, and it is considered that an Ar/Si ratio of 0.162 of the film produced at 20 W is a maximum value of the Ar/Si ratio of the film. Even in the film whose Ar/Si ratio was 0.162 (film produced at 20 W), the insulation characteristic was excellent. Therefore, according to the present invention, the upper limit value of the Ar/Si ratio is considered to be 17 at. % (Ar/Si$\leqq$17 at. %). When the figures below the third decimal place of the maximum value of the Ar/Si ratio are omitted and a region is defined on the basis of the plot of the experimental data, Ar/Si$\leqq$16 at. % is obtained. Thus, the region can be defined as a region in which the effect of reduction in leak current is obtained in a higher probability.

The reason why the insulation characteristic is improved in the case where a relatively large amount of Ar is contained in the amorphous insulator film made of Si oxide is not necessarily made clear. However, the inventors of the present invention have considered as follows. As disclosed in Journal of Applied Physics, Volume 78, pp. 962 to 968, when an Si oxide film is formed by a vapor phase film formation method such as a vapor deposition method, a large number of micro pores are produced in the Si oxide film.

Therefore, after the film formation, if only the Si oxide film is taken out from a vacuum chamber to be exposed to the air, water molecules penetrate the Si oxide film and stay in the micro pores. It is considered that the water molecules in the Si oxide film cause the insulation characteristic thereof to deteriorate (contribute electrical conduction thereof).

While the insulator film according to the present invention is formed in the vacuum chamber, Ar is introduced into the micro pores, with the result that water molecules are prevented from entering the insulator film. The density of the insulator film of this experimental example was measured by an X-ray reflectivity (XRR) measurement method. As a result, the density increases as the amount of Ar (Ar/Si ratio) increases. This means that there is no change or a small change in volume of the insulator film which is caused by the introduction of Ar into the film.

That is, this is not contradictory to the above-mentioned model such that Ar is present in the micro pores of the insulator film. Therefore, when Ar is introduced into the micro pores of the insulator film in advance, it may be expected that the water molecules can be prevented from entering the insulator film in the case where the insulator film is taken out from the vacuum chamber to be exposed to air and thus the excellent insulation characteristic can be maintained.

When a correlation between the Ar/Si ratio in the Si oxide amorphous insulator film produced in the film formation condition and the insulation characteristic thereof is controlled as above, the insulator film having the excellent insulation characteristic can be obtained in the region of the Ar/Si ratio as described above. However, for example, when the insulator film is formed in a condition in which the insulator film is hit with a higher-energy Ar ion, Si—O bonds may be broken by Ar ion impact as known in the prior art, to thereby form an insulator film whose insulation characteristic is inferior.

Therefore, in order to obtain the insulator film having the excellent characteristic in the region of the Ar/Si ratio as described above, the film formation condition is important. When the insulator film produced in a film formation condition set according to the condition employed by the inventors of the present invention has such an Ar/Si ratio as described above, a current density when an electric field of 1 MV/cm is applied is equal to or smaller than $1 \times 10^{-6}$ A/cm$^2$, desirably equal to or smaller than $3 \times 10^{-7}$ A/cm$^2$. Thus, the insulator film according to the present invention is different from the film produced in the conventional film formation condition (such as high-energy Ar ion hit condition) and corresponds to the film having the Ar/Si ratio and the insulation characteristic (current density) as described above.

EXAMPLE

Next, the present invention will be specifically described by way of working examples. However, the present invention is by no means limited thereto.

Example 1

Amorphous Insulator Film

In Example 1 of the present invention, a multilayer of a Ti layer (5 nm in thickness), an Au layer (40 nm in thickness), and a Ti layer (5 nm in thickness) was formed as a bottom electrode on a glass substrate by a sputtering method using a Ti target and an Au target. An $SiO_2$ film was formed on the multilayer with a thickness of 100 nm by an rf magnetron sputtering apparatus using an $SiO_2$ target. The film formation condition is as follows. The substrate was placed at such a position that the center of the substrate was located in a direction tilted by approximately 55 degrees relative to the vertical direction of the center of the target and a distance between the center of the target and the center of the substrate was approximately 130 mm.

The substrate and the substrate holder were maintained in an electrical insulation state (open state). The film formation gas was only an Ar gas. A film formation gas pressure was 0.1 Pa. Sputtering power was 20 W. A temperature set at the time of film formation and an indication temperature of a thermometer each were 20° C. In addition to the substrate provided with the bottom electrode, an Si substrate for Ar/Si composition analysis using a fluorescent X-ray was placed. The film formation was performed on both the substrates at the same time.

Au(40 nm)/Ti(5 nm) multilayer electrodes each having a diameter of 0.3 mm were formed on the $SiO_2$ film to produce parallel-plate capacitor devices as illustrated in FIG. 2. In FIG. 2, reference numeral 1 denotes the glass substrate, reference numeral 2 denotes the bottom electrode (Ti/Au/Ti), reference numeral 3 denotes the $SiO_2$ film, and reference numeral 4 denotes top electrode (φ0.3 mm, Ti/Au/Ti).

Next, the current-voltage (I-V) characteristics of the capacitor devices were evaluated by current measurement based on the application of voltage. The $SiO_2$ film formed on the Si substrate for Ar/Si ratio evaluation was subjected to X-ray fluorescence (XRF) analysis analysis to evaluate the amount of Ar and the amount of O which were contained in the $SiO_2$ film. Then, a ratio of the number of Ar atoms to the number of Si atoms (Ar/Si ratio) in the film was obtained on the basis of an Si value and an O value which were obtained by XRF analysis of an $SiO_2$ film formed on a carbon substrate.

FIG. 1 illustrates a correlation between the Ar/Si ratio of the formed $SiO_2$ film and a current density when an electric field of 1 MV/cm was applied. A point plotted at the rightmost position of FIG. 1 corresponds to the value of the $SiO_2$ film obtained in this example. Thus, it was found to exhibit an excellent insulation characteristic value in which the current density when the electric field of 1 MV/cm was applied was equal to or smaller than $1 \times 10^{-6}$ A/cm$^2$ and equal to or smaller than $3 \times 10^{-7}$ A/cm$^2$.

Example 2

TFT Device

Figure 3:
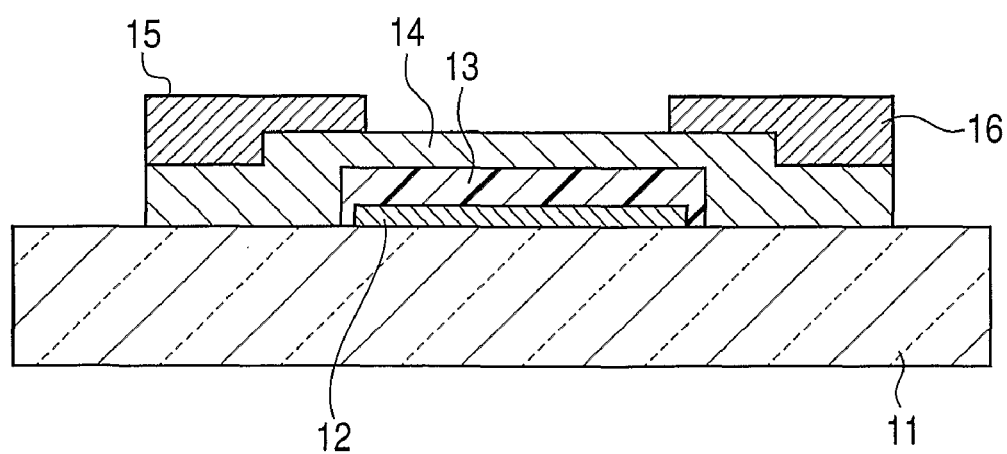
FIG. 3 is a schematic view illustrating a structure of a bottom gate TFT which is used in Experimental Example and Example 2 according to the present invention.
Figure 4:
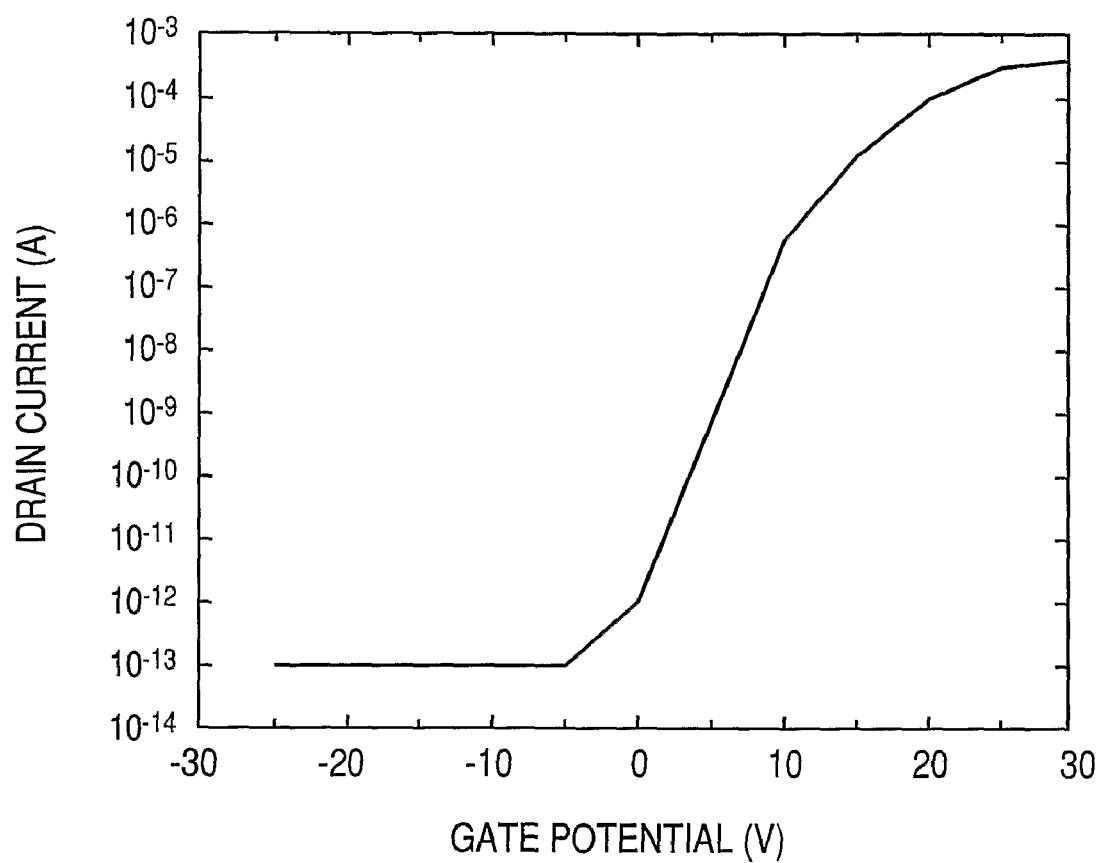
FIG. 4 is a graph illustrating a transfer characteristic of a bottom gate TFT whose gate-insulator film is the amorphous insulator film according to the present invention and whose channel layer is an amorphous oxide film.

In Example 2 of the present invention, a bottom gate TFT device using the amorphous insulator film according to the present invention, which is illustrated in FIG. 3, was produced.

As illustrated in FIG. 3, a Ti(5 nm)/Au(40 nm)/Ti(5 nm) multilayer was formed as a gate electrode 12 on a glass substrate 11 by electron beam evaporation and shaped by a photolithography method and a lift-off method.

An $SiO_2$ film having a thickness of 100 nm was formed as a gate insulator film (referred to also as "$SiO_2$ film") 13 on the gate electrode 12 by means of an rf magnetron sputtering apparatus using an $SiO_2$ target. The film formation condition is as follows. Sputtering power was 400 W. A sputtering gas pressure was 0.1 Pa. A sputtering gas composition Ar/$O_2$ was 50/50. The film formation was performed at room temperature. The amount of Ar contained in the $SiO_2$ film in such a condition was 4.9% in terms of the Ar/Si ratio. After that, the $SiO_2$ film 13 was shaped by a photolithography method and an etching method.

Next, an $In_xGa_yZn_zO_v$ film having a thickness of 40 nm was formed as a channel layer 14 at room temperature by rf magnetron sputtering using an $InGaO_3(ZnO)$ target. The obtained $In_xGa_yZn_zO_v$ film was amorphous. Symbols x, y, z, and v are $0<x\leq1$, $0<y\leq1$, $0<z\leq1$, and $0<v\leq4$, respectively.

Next, the $In_xGa_yZn_zO_v$ film 14 was processed to a necessary size by etching and then a source electrode 15 and a drain electrode 16 were formed by a photolithography method and a lift-off method.

The electrode material film is an Au(150 nm)/Ti(5 nm) multilayer and a film formation method thereof is an electron beam vapor deposition method. TFT devices were manufactured through the above-mentioned process. Among the obtained TFT devices, a transfer characteristic (drain current-gate voltage characteristic) of a TFT device having a gate length of 10 μm and a gate width of 60 μm was measured, and such a characteristic as illustrated in FIG. 4 was obtained. As illustrated in FIG. 4, the TFT device was obtained in which a gate leak current value was small even in the case of application of a high voltage, exhibiting an excellent characteristic.

As described above, when the amorphous insulator film according to the present invention is used as the gate-insulator film of the TFT device, the amorphous oxide semiconductor channel TFT device having the excellent characteristic can be obtained at room temperature. This is effective not only in a process at room-temperature process but also in a process at raised temperature. In particular, this is effective in a process at temperatures less than 300° C. to which a CVD process cannot be applied. Even in the case of a TFT device using a crystalline oxide semiconductor as a TFT channel, the same effect is obtained.

This application claims the benefit of Japanese Patent Application No. 2007-037994, filed Feb. 19, 2007 which is hereby incorporated by reference herein in its entirety.

The invention claimed is:

1. An amorphous insulator film which is used as a gate-insulator film of a thin-film transistor and comprises silicon oxide, wherein
   the amorphous insulator film includes Ar;
   Ar is included therein in an amount of equal to or larger than 3 at. % and equal to or smaller than 17 at. % in terms of atomic ratio with respect to Si; and
   the amorphous insulator film has density which increases with the amount of Ar increases.

2. An amorphous insulator film according to claim 1, wherein the amount of Ar included in the amorphous insulator film is equal to or larger than 5 at. % or equal to or smaller than 16 at. % in terms of atomic ratio with respect to Si.

3. An amorphous insulator film according to claim 1, wherein the amorphous insulator film has a current-voltage characteristic in which a current density when an electric filed of 1 MV/cm is applied to the amorphous insulator film is equal to or smaller than $1\times10^{-6}$ A/cm$^2$.

4. An amorphous insulator film according to claim 1, wherein the amorphous insulator film has a current-voltage characteristic in which a current density when an electric filed of 1 MV/cm is applied to the amorphous insulator film is equal to or smaller than $3\times10^{-7}$ A/cm$^2$.

5. An amorphous insulator film according to claim 1, wherein the amorphous insulator film is produced by a sputtering method.

6. A thin-film transistor wherein the amorphous insulator film according to claim 1 is used as a gate-insulator film.

7. A thin-film transistor according to claim 6, which includes a channel comprising an oxide semiconductor.

8. A thin-film transistor according to claim 6, which includes a channel comprising an amorphous oxide semiconductor.

\* \* \* \* \*